United States Patent [19]

Allman et al.

[11] Patent Number: 5,322,805

[45] Date of Patent: Jun. 21, 1994

[54] METHOD FOR FORMING A BIPOLAR EMITTER USING DOPED SOG

[75] Inventors: Derryl D. J. Allman; Gayle W. Miller, both of Colorado Springs, Colo.

[73] Assignee: NCR Corporation, Dayton, Ohio

[21] Appl. No.: 961,973

[22] Filed: Oct. 16, 1992

[51] Int. Cl.$^5$ .................................. H01L 21/225
[52] U.S. Cl. ..................... 437/31; 437/164; 437/231
[58] Field of Search .............. 437/31, 164, 909, 231; 148/DIG. 11

[56] References Cited

U.S. PATENT DOCUMENTS

| | | | |
|---|---|---|---|
| 3,748,198 | 7/1973 | Basi et al. | 437/164 |
| 3,928,225 | 12/1975 | Schäfer | 252/182 |
| 4,355,454 | 10/1982 | Tasch, Jr. et al. | 29/571 |
| 4,433,008 | 2/1984 | Schnable et al. | 427/85 |
| 4,455,325 | 6/1984 | Razouk | 427/85 |
| 4,571,366 | 2/1986 | Thomas et al. | 428/446 |
| 4,603,468 | 8/1986 | Lam | 29/571 |
| 4,606,114 | 8/1986 | Kraus | 29/571 |
| 4,628,589 | 12/1986 | Sundaresan | 29/571 |
| 4,661,177 | 4/1987 | Powell | 148/189 |
| 4,725,564 | 2/1988 | Van Dalen | 437/164 |
| 4,806,499 | 2/1989 | Shinohara | 437/31 |
| 4,835,113 | 5/1989 | Celler et al. | 437/37 |
| 4,837,179 | 6/1989 | Foster et al. | 437/44 |
| 4,891,331 | 1/1990 | Rapp | 437/164 |
| 4,980,302 | 12/1990 | Shimizu | 437/31 |
| 4,996,168 | 2/1991 | Ozaki et al. | 437/164 |
| 5,024,959 | 6/1991 | Pfiester | 437/34 |
| 5,047,357 | 9/1991 | Eklund | 437/31 |
| 5,158,904 | 10/1992 | Ueda et al. | 437/45 |
| 5,186,745 | 2/1993 | Maniar et al. | 106/287.16 |
| 5,200,358 | 4/1993 | Bollinger et al. | 437/180 |

FOREIGN PATENT DOCUMENTS

| | | | |
|---|---|---|---|
| 957598 | 11/1974 | Canada | 437/164 |
| 0229427 | 7/1987 | European Pat. Off. | 437/164 |
| 53-135263 | 11/1978 | Japan . | |
| 57-194525 | 11/1982 | Japan . | |
| 61-87322 | 5/1986 | Japan . | |
| 61-196574 | 8/1986 | Japan | 437/164 |
| 62-60220 | 3/1987 | Japan . | |
| 62-216322 | 9/1987 | Japan . | |
| 1-8615 | 1/1989 | Japan . | |
| 1-194416 | 8/1989 | Japan . | |
| 1-283828 | 11/1989 | Japan . | |

OTHER PUBLICATIONS

Stanley Wolf, "Silicon Processing for the VLSI ERA" vol. 2, Lattice Press, Sunset Beach, CA, pp. 194–207, 486–497, (1990).

*Primary Examiner*—Robert Kunemund
*Assistant Examiner*—Ken Horton
*Attorney, Agent, or Firm*—Paul W. Martin

[57] ABSTRACT

A method for forming a bipolar emitter using doped SOG which employs diffusion instead of implanting, and which produces a shallow, low-resistance emitter using a variety of dopants besides boron and phosphorus. A layer of doped SOG is spun over a predefined base region. Portions of the SOG layer are defined for removal and removed, leaving the collector and emitter contact areas exposed. The SOG layer is densified and the dopants are driven into the base to form the emitter.

11 Claims, 3 Drawing Sheets

METHOD FOR FORMING A BIPOLAR EMITTER USING DOPED SOG

CROSS REFERENCE TO RELATED APPLICATIONS

The present invention is related to the following commonly assigned and co-pending U.S. applications, which have been filed concurrently with the present application:

"Shallow Junction SOG Process", invented by Allman et al., and having a Ser. No. 07/965,822;

"Selective Sidewall Diffusion Process Using Doped SOG", invented by Allman et al., and having a Ser. No. 07/961,967;

"Bipolar Transistor Formation Using Doped SOG", invented by Allman et al., and having a Ser. No. 07/965,823; and "Global Planarization Using Doped SOG and Chemical Metal Polish", invented by Allman et al., and having a Ser. No. 07/965,309.

BACKGROUND OF THE INVENTION

The present invention relates to methods for producing integrated circuit devices and more specifically to a method for forming a bipolar emitter using doped spin on glass (SOG).

Known methods for forming emitters in bipolar complimentary metal oxide semiconductor (BiCMOS) devices involve a masking operation followed by an implant operation in which n-type and p-type impurities are implanted into a substrate, typically silicon. In such a process, the implant energy has to be reduced to produce shallow junctions.

This method suffers from the disadvantage that implanting produces defects which lie in the space charge region of the junction. The implanted impurity is brought to rest by an inelastic collision with silicon atoms in the crystal lattice, which damages the crystal lattice structure by knocking silicon atoms out of place. The crystal lattice structure must be epitaxially regrown by a thermal anneal to activate the implanted impurities by incorporating them into the crystal lattice. For shallow junctions, a rapid thermal process (RTP) cycle is typically done. However, the damage from implanting is not totally repairable without causing undesirable enhanced diffusion of the impurity which is inconsistent with shallow junction technology. Defect sites having energies in the middle of the band gap remain and produce a conduction path which ultimately causes a leakage current to flow.

Another known method for forming bipolar emitters includes the steps of depositing a layer of undoped polysilicon, masking off predetermined areas on the polysilicon, doping the unmasked areas of polysilicon with boron or phosphorus species, and heating the polysilicon to drive the species out of the polysilicon.

This method suffers from the disadvantage that the species are limited to boron and phosphorus and the resistance of the polysilicon line is quite high.

Therefore, it would be desirable to provide a process for forming a low-resistance bipolar emitter with a shallow junction, which does not suffer from the disadvantages of known process steps.

SUMMARY OF THE INVENTION

In accordance with the teachings of the present invention, a method for forming a bipolar emitter using doped SOG is provided which employs diffusion instead of implanting, and which produces a shallow, low-resistance emitter using a variety of dopants besides boron and phosphorus. A layer of doped SOG is spun over a predefined base region. Portions of the SOG layer are defined for removal and removed, leaving the collector and emitter contact areas exposed. The SOG layer is densified and the dopants are driven into the base to form the emitter.

A method for forming a semiconductor device having a bipolar emitter is also disclosed. A layer of doped SOG is spun over a predefined base. Portions of the SOG layer are defined for removal and removed, if desired, leaving the base exposed. The SOG layer is densified and the dopants are driven out of the SOG layer by heating the wafer using a RTP thermal cycle for shallow junction formation. The remainder of the SOG layer is removed, if desired. The device is planarized by depositing a boron-phosphorous silicon glass (BPSG) layer on the device, if desired. An undoped oxide barrier layer is deposited before the BPSG oxide layer in order to prevent diffusion of the dopants into the exposed emitter portions within the device. Metal contact holes are cut through the BPSG and barrier oxide layers to expose the emitter, base, and collector contact areas. A metal interconnect layer is formed on the device. Typical semiconductor interconnect processing is done to finish the device after the first metal interconnect layer is formed.

A semiconductor bipolar device formed using the method of the present invention includes a collector, a base above the collector, and an emitter above the base. The emitter and a low resistance cutout to the collector are formed by driving the dopant material out of the SOG layer through the window in the field oxide region on the silicon wafer.

It is accordingly an object of the present invention to provide a method for forming a bipolar emitter in a semiconductor device using doped SOG.

It is another object of the present invention to provide a method for forming a bipolar emitter in a semiconductor device using doped SOG which provides shallow junction semiconductor devices without defects and leaky junctions.

It is another object of the present invention to provide a method for forming a bipolar emitter in a semiconductor device using doped SOG which provides for additional dopant choices besides boron and phosphorus.

It is another object of the present invention to provide a semiconductor device using the method of the present invention.

BRIEF DESCRIPTION OF THE DRAWINGS

Additional benefits and advantages of the present invention will become apparent to those skilled in the art to which this invention relates from the subsequent description of the preferred embodiments and the appended claims, taken in conjunction with the accompanying drawings in which:

DETAILED DESCRIPTION OF THE PREFERRED EMBODIMENT

Figure 1:
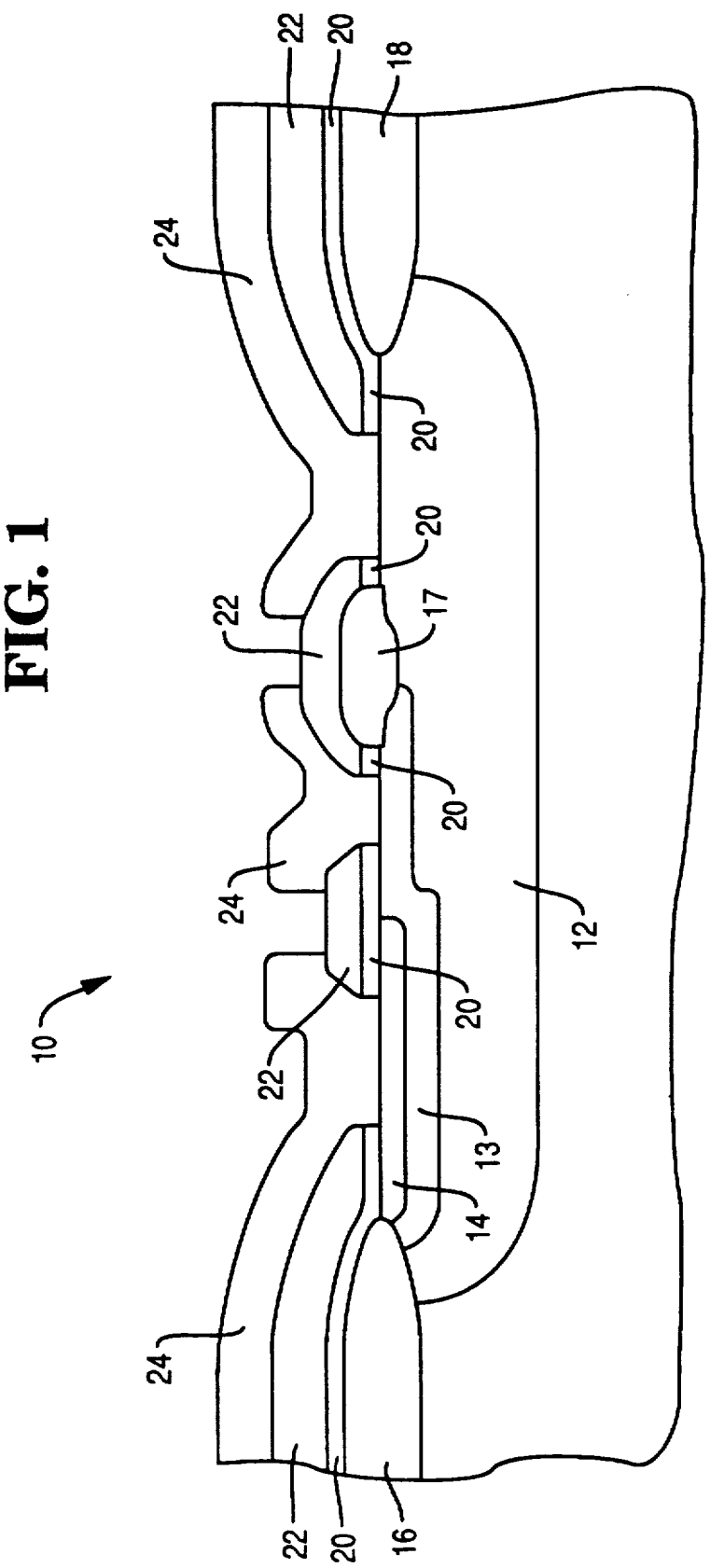
FIG. 1 is a cross-sectional view of a semiconductor device containing a bipolar emitter formed using the method of the present invention.

Referring now to FIG. 1, a semiconductor device 10 manufactured using the method of the present invention is shown. Device 10 includes underlying collector 12, base 13, emitter 14, field oxide portions 16–18, barrier layer 20, BPSG oxide layer 22, and a metal layer 24. Preferably, device 10 has a vertical design, in which layers are added vertically. However, the present invention is suited for use in forming laterally oriented devices as well.

Figure 2:
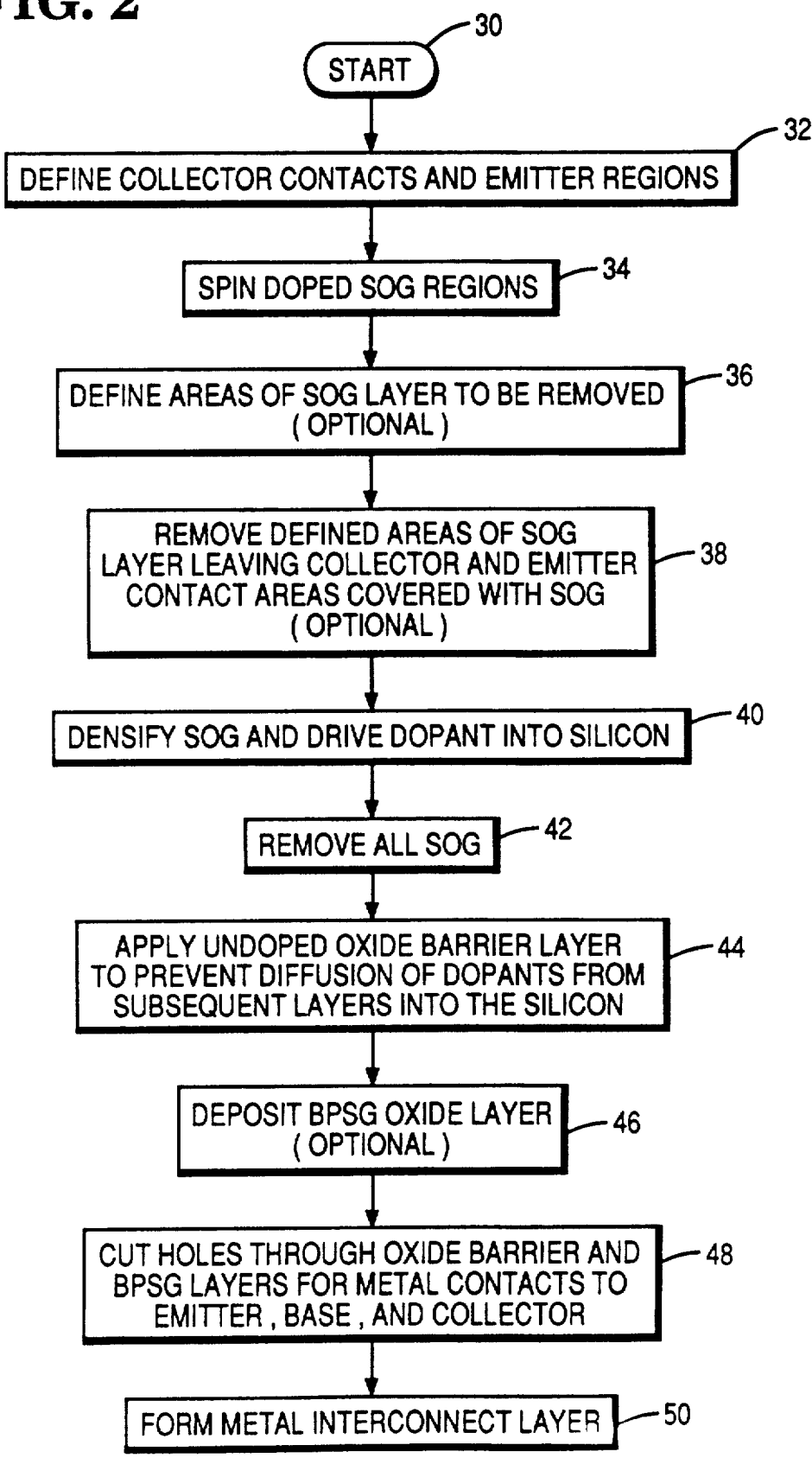
FIG. 2 is a flow diagram of the method of the present invention.

Referring now to FIG. 2, the method of the present invention begins at START 30. In block 32, the collector and base regions are defined using known BiCMOS process steps.

In block 34, layer 28 (FIG. 3) of doped SOG is spun onto base 13 at a thickness of about 1000 angstroms to 15 microns. Layer 28 may include, but not be limited to, dopants such as arsenic, antimony, and gold, in addition to boron and phosphorus. Gold may be combined with the emitter dopant to increase the generation or recombination rate of electrons, thus allowing device 10 to operate at higher frequencies. This step is optional; the SOG can cover the entire wafer if desired.

In block 36, the emitter and collector contact areas are defined with a standard photolithography step, in which those areas of layer 12 to be removed are covered with an emulsion. This step is optional; the SOG can cover the entire wafer if desired.

Figure 3:
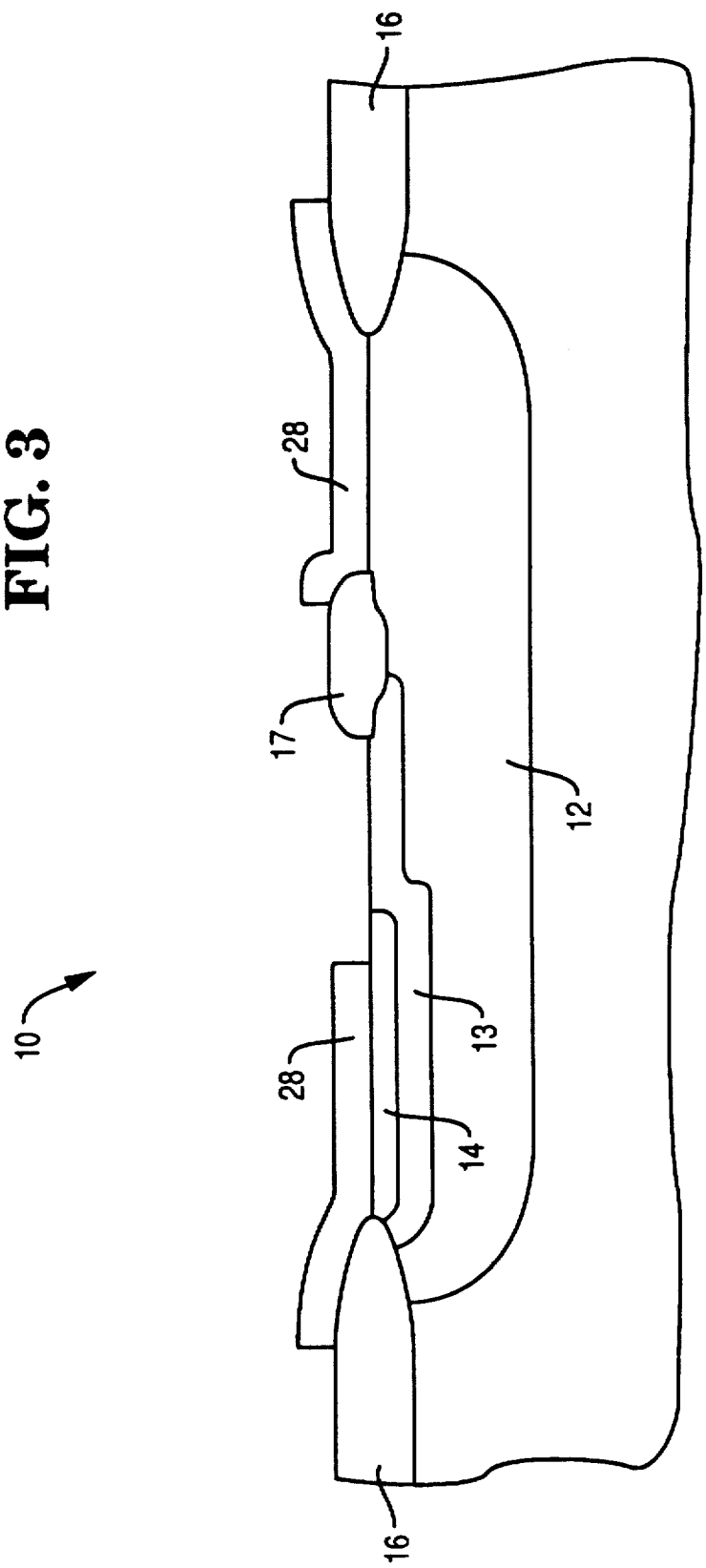
FIG. 3 is a cross-sectional view of the semiconductor device of FIG. 1 in a partially completed state at which the emitter is formed.

In block 38, a plasma etch process is preferably employed to remove areas covered with emulsion, leaving doped SOG behind in the emitter and collector contact regions (FIG. 3). The emulsified areas of SOG layer 28 may also be removed by a wet etch process, which causes the highly doped SOG layer 28 to be etched away at an extremely fast rate. This is an optional step; the SOG can cover the entire wafer, if desired.

In block 40, layer 28 is densified, and the dopant is driven out of layer 28 and into silicon 13 heating the wafer using a furnace cycle or RTP cycle at preferably about 1000 to 1150 degrees Celsius. If a furnace cycle is employed, the heating time can be anywhere from about 30 seconds to 2 days. The heating time and temperature depends upon the dopant used. If an RTP cycle is employed, heating time can be from about 2 to 90 seconds.

If boron is used as a dopant for the emitter, the preferred heating time in a furnace is about 5 minutes to 3 hours. If an RTP thermal cycle is used to drive the phosphorus out of the SOG and into the silicon. A preferred heating time is between about 10 seconds and 120 seconds. These preferred heating times assume that the temperature of the furnace is between about 900 and 1150 degrees Celsius and the temperature of the RTP system is between 1000 and 1175 degrees Celsius. Note that the SOG used in the present invention may contain multiple dopants, for example, gold and phosphorus.

Advantageously, a shallow-depth, low-resistance emitter is formed without crystal damage.

In block 42, SOG layer 28 is completely removed by etching, preferably using a wet etch process, if desired.

In block 44, an undoped oxide is applied to form a barrier layer 20 to prevent diffusion of phosphorus and boron out of the subsequent BPSG oxide layer into the underlying silicon layer (FIG. 1). Such undoped oxides may include tetra-ethyl-ortho-silicate (TEOS), other organic oxide sources, hydride sources, or non-organic spin-on oxides.

In block 46, boron-phosphorus doped SOG (BPSG) is deposited as an intermediate layer 22 between the metal interconnect and the polysilicon (active) region to planarize the topology of device 10. This is an optional step. Other methods may be employed to planarize the surface of the wafer.

In block 48, holes are cut through layers 20 and 22 to facilitate bonding of metal contacts to the emitter, base, and collector regions.

In block 50, metal interconnect layer 24 is formed.

While the method of the present invention has been employed to form a shallow-junction emitter, the method may also be employed to form base and collector regions.

Although the present invention has been described with particular reference to certain preferred embodiments thereof, variations and modifications of the present invention can be effected within the spirit and scope of the following claims.

What is claimed is:

1. A method for forming an emitter in a semiconductor device having a collector and a base comprising the step of:

spinning a layer of doped SOG having a dopant onto the base.

defining first portions of the SOG layer to be removed;

removing the defined first portions leaving a second portion of the SOG layer over the base;

densifying the SOG layer;

driving the dopants from the SOG layer into the base;

removing the second portion of the SOG layer;

applying a barrier layer over the device;

applying a BPSG layer on the barrier layer;

forming a hole through the barrier layer and the BPSG layer over the emitter; and applying a metal interconnect to the emitter through the hole.

2. The method as recited in claim 1, wherein the doped SOG is spun to a thickness of about 100 angstroms to 15 microns.

3. The method as recited in claim 1, wherein the SOG layer is doped with boron.

4. The method as recited in claim 1, wherein the SOG layer is doped with phosphorus.

5. The method as recited in claim 1, wherein the SOG layer is doped with arsenic.

6. The method as recited in claim 1, wherein the SOG layer is doped with antimony.

7. The method as recited in claim 1, wherein the SOG layer is doped with gold.

8. The method as recited in claim 1, wherein the step of defining comprises the substeps of:

coating the first portions of the SOG layer to e removed with an emulsion.

9. The method as recited in claim 1, wherein the step of removing comprises the step of:

etching the first portions.

10. The method as recited in claim 1, wherein the step of driving comprises the substep of:

heating the SOG layer in a furnace cycle at about 1000 to 1150 degrees Celsius for about 5 minutes to 3 hours.

11. The method as recited in claim 1, wherein the step of driving comprises the substep of:

heating the SOG layer in an RTP cycle at about 1000 to 1150 degrees Celsius for about 10 to 900 seconds.

* * * * *

UNITED STATES PATENT AND TRADEMARK OFFICE
CERTIFICATE OF CORRECTION

PATENT NO. : 5,322,805
DATED : June 21, 1994
INVENTOR(S) : Derryl D.J. Allman et al.

It is certified that error appears in the above-indentified patent and that said Letters Patent is hereby corrected as shown below:

Column 4, line 56, delete "e" and substitute --be--.

Signed and Sealed this

Twelfth Day of September, 1995

Attest:

BRUCE LEHMAN

Attesting Officer            Commissioner of Patents and Trademarks